United States Patent [19]  [11] 4,282,136
Hunt et al.  [45] Aug. 4, 1981

[54] FLAME RETARDANT EPOXY MOLDING COMPOUND METHOD AND ENCAPSULATED DEVICE

[76] Inventors: Earl R. Hunt, 2408 Cherry Hill Dr., Toledo, Ohio 43615; Robert K. Rosler, 4751 Santa Maria Dr., Toledo, Ohio 43614; James O. Peterson, 6752 Gettysburg Dr., Sylvania, Ohio 43615

[21] Appl. No.: 28,155
[22] Filed: Apr. 9, 1979
[51] Int. Cl.³ ............................................. C08L 63/00
[52] U.S. Cl. ................................. 260/38; 260/37 EP; 260/45.75 B; 427/82; 525/481; 525/485; 528/88; 528/112; 528/119
[58] Field of Search .................. 525/455, 481; 528/88, 528/112, 119; 260/37 EP, 38

[56] References Cited
U.S. PATENT DOCUMENTS 4,042,550  8/1967  Tuller ............................... 260/280 P
4,123,398  10/1978  Unray ........................... 260/17.4 CL Primary Examiner—Paul Lieberman

[57] ABSTRACT

The high temperature stability of devices encapsulated with a flame retardant epoxy molding compound is improved by including in the encapsulant as synergistic flame retardant a halogen-containing organic compound (preferably of the reactive type) and antimony pentoxide. The encapsulant may be prepared from an epoxy, a hardener preferably of the novolac or anhydride type, a catalyst, a mold release agent, preferably a filler, preferably a colorant, preferably a coupling agent, the halogen-containing organic compound (which may be part of the resin or the hardener) and antimony pentoxide. Such encapsulants, when used to encapsulate semiconductor devices, have improved high temperature compatability compared to similar molding compounds with antimony trioxide or antimony tetraoxide.

24 Claims, No Drawings

FLAME RETARDANT EPOXY MOLDING COMPOUND METHOD AND ENCAPSULATED DEVICE

DESCRIPTION

BACKGROUND OF THE INVENTION

Epoxy molding compounds have found wide use as encapsulants of semiconductor devices such as integrated circuits, transistors and diodes, passive devices and other electronic components. Such encapsulants contain an epoxy, a hardener, a catalyst, a mold release agent, usually a filler, usually a colorant and sometimes a coupling agent. Exemplary formulations of these ingredients are described in U.S. Pat. No. 4,042,550 to Tuller et al., 4,034,014 to Curtis, Jr. et al., 3,849,187 to Fetscher et al., 3,862,260 to Sellers et al., 3,789,038 to Curtis et al. and 3,280,216 to Partansky et al. Such compositions are generally classified by the type of hardener, with phenol-derived and substituted phenol-derived resin, carboxylic acid anhydride and amine hardeners being most common. Frequently, the molding compounds are highly filled (over 50% filler by weight), but for some applications low filler compositions or even unfilled compositions may be used.

In recent years, requirements of electronic industries have necessitated flame retardant grades of these epoxy molding compounds. Additives to improve the flame retardancy, as measured for example by UL-94, have been proposed including halogenated compounds, certain transition metal oxides and hydrated alumina. Unfortunately many good flame retardant additives detract from the compatibility of the encapsulant with semiconductor devices at high temperatures. In a copending application of Robert K. Rosler, U.S. Ser. No. 813,201, filed July 5, 1977, a filled epoxy novolac molding compound is described with a synergistic combination of antimony trioxide and a reactive halogenated organic compound as flame retardant. Similarly, U.S. Pat. 4,042,550 describes epoxyanhydride molding compounds with secondary fillers including antimony trioxide or antimony tetraoxide and, in flame retardant types, halogenated compounds. While such a flame retardant combination provides good flame retardance and satisfactory compatibility on electronic devices, a need still exists for flame retardant epoxy molding compounds of all types with improved compatibility.

BRIEF DESCRIPTION OF THE INVENTION

The present invention includes an improved method of encapsulating a semiconductor device wherein an encapsulant comprising an epoxy, a hardener, a catalyst, a mold release agent, optionally a filler, optionally a colorant, optionally a coupling agent and a flame retardant system is heat cured around a semiconductor device. In the improvement, the flame retardant system comprises antimony pentoxide and a halogen-containing organic compound, preferably of the reactive type.

The present invention also includes an improved flame retardant thermosetting epoxy molding compound of the type containing an epoxy, a hardener, a catalyst, a mold release agent, optionally a filler, optionally a colorant, optionally a coupling agent and a flame retardant system wherein the flame retardant system comprises antimony pentoxide and a halogen-containing organic compound, preferably of the reactive type.

The present invention also includes an improved encapsulated semiconductor device wherein the encapsulant is as described above with, as flame retardant system, antimony pentoxide and a halogen-containing organic compound, preferably of the reactive type.

In all three instances the halogen-containing organic compound may be a separate ingredient, but is preferably a part of either the epoxy or the hardener. By "reactive type" is meant, however, not only halogen-containing organic compounds which are part of the epoxy resin or the hardener, but also other halogen-containing organic compounds which become chemically incorporated into the product of the epoxy resin and the hardener upon setting. The halogen-containing organic compound may also be part of other ingredients such as the lubricant or the colorant.

DETAILED DESCRIPTION OF THE INVENTION

The present invention relates to an improved flame retardant agent for epoxy molding compounds. While the invention relates particularly to epoxy novolac molding compounds and epoxy anhydride molding compounds, it is not so limited and is applicable as well to epoxy amine and other epoxy molding compounds.

Thus, any epoxy normally used in such molding compounds can be used in the flame retardant molding compounds of the present invention. In general, multifunctional epoxy resins, typically epoxidized phenol novolacs and epoxidized cresol novolacs, are used. Other epoxies, such as the glycidyl ether of Bisphenol A or of tetraphenol ethane or dicyclopentadiene dioxide, are also suitable. Thus the term "epoxies" is not to be understood as requiring a polymeric material as is generally understood for the term "epoxy resins," but rather as including any material containing two or more reactive oxirane groups.

Similarly, in the case of epoxy novolac molding compounds, any novolac hardener of the type conventionally used may be employed in the present flame retardant epoxy molding compounds. For example, phenolic novolacs, cresolic novolacs and Bisphenol A derivatives are suitable. This group is referred to herein by the broad term "phenol-derived and substituted phenol-derived" resin to include all such compounds conventionally used as hardeners for epoxy resins based upon reactive phenolic groups.

In the case of epoxy anhydride molding compounds, the present invention is particularly applicable to encapsulants employing as hardener a polyanhydride of maleic monomer and at least one alkyl styrene monomer (or prepolymers of the polyanhydride and the epoxide) as described in above referenced U.S. Pat. Nos. 4,042,550 and 3,789,038. The present invention is also applicable to epoxy molding compounds with, as hardener, the benzophenone tetracarboxylic dianhydrides described in U.S. Pat. No. 3,468,824 to Williams, and the anhydrides described in U.S. Pat. Nos. 3,272,843 and 3,336,260 to Spatz et. al. Similarly, the flame retardant system of the present invention may be used with other anhydrides as hardeners such as are employed in combination with epoxy resins in various applications.

A variety of catalysts, appropriate to the hardener used, may be employed to promote the curing of the present compositions. Such catalysts include basic and acidic catalysts such as the metal halide Lewis acids, e.g. boron trifluoride, stannic chloride, zinc chloride and the like; metal carboxylate salts such as stannous octoate and the like; and amines, e.g., alpha-methyl benzyl-dimethylamine, dimethylethylamine, dimethylaminomethylphenol, 2,4,6-tris(dimethylaminomethyl)phenol, triethylamine, and imidazole derivatives and the like. The catalysts are employed in conventional amounts such as from about 0.1 to 5.0% by weight of the combined weight of epoxy and hardener.

Mold release agents (that is lubricants) are generally included in the epoxy molding compounds of the present invention. Exemplary are carnauba wax; montanic acid ester wax; polyethylene wax; polytetrafluoroethylene wax; glycerol monostearate; calcium, zinc and other metallic stearates; paraffin waxes and the like.

For many applications, the epoxy molding compounds are preferably filled, and more preferably contain at least about 50 weight percent filler. The filler may comprise one or more of the several conventional fillers such as silica, calcium carbonate, calcium silicate, aluminum oxide, glass fibers, clay or talc. Especially preferred are filled compositions wherein the filler is predominantly silica. Other fillers are preferably employed in lesser amounts in combination with silica as the predominant filler. Many of the epoxy molding compounds of the present invention also contain a colorant such as carbon black, pigments, dyes and the like.

Many of the epoxy molding compounds of the present invention also include a coupling agent, and especially a silane coupling agent of the type known to improve wet electrical properties of the composition. The silane coupling agents may be characterized by the formula R'-Si(OR)$_3$ where R' represents an organo-functional group such as amino, mercapto, vinyl, epoxy or methacryloxy, and OR represents a hydrolyzable alkoxy group attached to the silicon. Preferred coupling agents are described in U.S. Pat. Nos. 4,042,550 and 3,849,187, both referenced above.

The halogen-containing organic compound used in the composition may be of any type, but is preferably of the reactive type and preferably has, as halogen, chlorine or bromine. Exemplary halogenated organic compounds are described in U.S. Pat. No. 4,042,550, which description is incorporated herein by reference and includes especially halogenated bisphenol A and derivatives of bisphenol A such as tetrabromo bisphenol A. Exemplary of reactive halogenated organic compounds which should be counted as a part of the epoxy resin are glycidyl ethers of halogenated resins such as the diglycidyl ether of tetrabromobisphenol A. The halogenated-containing organic may be a separate additive or may be contained in one or more of the organic components of the molding compound, especially the epoxy or the hardener, but also possibly other components such as the lubricant, or the colorant or the filler (if organic). The term "halogen-containing" is meant to include organic compounds in which the halogen is present from any source including halogenation of a component or its precursor (such as a monomer) or by addition of halogen-containing monomers by reactions in which the halogen is not completely removed.

Exemplary of reactive halogen-containing organic compounds which should be counted as part of the hardener are halogenated anhydrides such as tetrabromo-and tetrachloro-phthallic anhydride. Tetrabromobisphenol A and other such halogenated monomers may also be considered part of the hardener, especially the phenol-derived or substituted phenol-derived hardener.

In the present invention, antimony pentoxide rather than antimony tetraoxide or antimony trioxide is employed as the synergist for the halogen-containing organic compound. As shown in the examples that follow, formulations with antimony pentoxide have improved thermal device compatability compared to similar formulations employing the tetraoxide or trioxide. This is especially surprising in view of the prior art belief that antimony pentoxide (a known material) would act as an oxidizing agent.

Antimony pentoxide for the present compositions may be in any available form. Preferably, antimony pentoxide in colloidal form is used as described in U.S. Pat. No. 3,860,523 to Petrow et al. Such materials frequently contain alkali antimonate complexes and water as well as the antimony pentoxide itself.

Molding compositions of the present invention may be prepared by any conventional method. For example, the ingredients may be finely ground, dry blended and then densified on a hot differential roll mill, followed by granulation. More generally, the ingredients (or any portion of them) may be prepared as a fine powder, fed directly into a compounding device such as an extruder or prepared as a premix of raw materials. If less than all of the ingredients are present in the initial form, the remainder of the ingredients can be added prior to or during densification. Densification can be by mechanical compacting (with for example a preformer or a combining mill) in the case of a fine powder, and can be by an extruder or differential roll mill in the case of fine powders, direct feed or premix. It is also possible that premixes or densified forms (such as preforms and granular forms) containing less than all of the ingredients are fed to the ultimate mold in the system with the remaining ingredients in a similar or different form. Since the present invention resides in an improved flame retardant system for such a molding compound, it should be understood to include such compounds in any physical form or even as systems of two or more components. Where two or more components are used, one should contain the epoxy, the other the hardener. Preferably a portion of the filler is in each of these components and the catalyst is in the hardener component to avoid catalyzed homopolymerization of the epoxy. These compositions may be molded into various articles by application of the requisite temperature and pressure. For example, molding conditions for the encapsulated semiconductor of the present invention may range from about 300° to 400° F. (about 149°–204° C.), preferably about 350° to about 375° F. (about 177°–191° C.), at 400 to 1,500 psi, (about 28–105 kg/cm$^2$), preferably 500 to 900 psi (about 35–63 kg/cm$^2$), for a time ranging from about 30 to 120 seconds, preferably 60 to 90 seconds. Any suitable molding apparatus may be employed, such as a transfer press equipped with a multi-cavity mold.

The ratio between the various ingredients may vary widely. In general, the epoxy will be in proportion to a novolac hardener so as to give an oxirane: reactive hydroxy ratio between about 0.8 and about 1.25. Similarly, the epoxy will be in proportion to an anhydride hardener so as to give a molar ratio of oxirane groups to anhydride equivalent between about 1.7 and about 1.0, preferably between about 1.25 and about 1.11.

Whatever catalyst is employed is generally applied at levels sufficient to harden the epoxy molding compound under anticipated molding conditions. Usually amounts between about 0.1 and about 5 weight percent by combined weight of epoxy and hardener are sufficient. The mold release agent will be employed in amounts sufficient to give good release from the mold and, frequently, also to improve the wet electrical properties of the encapsulated semiconductor device. Lubricant proportions between about 0.01 and about 2 percent by weight of total composition, preferably between about 0.2 and about 1 percent by weight of total composition can be employed.

The total amount of filler may vary from 0 up to about 80 percent of the total composition. Preferably, the filler comprises a total of more than 50 weight percent of the total composition and more preferably between about 55 and about 75 weight percent of the total composition. Also, preferably, between about 55 and about 75 weight percent of the total composition is a silica filler. Colorants, if employed, are generally in amounts sufficient to give encapsulated devices the desired color which, in many cases, is black. Coupling agents, and in particular silane coupling agents, are provided in amounts sufficient to give the desired wet electrical properties and preferably between about 0.05 and 2 weight precent by total weight of composition, more preferably between about 0.2 and 0.5 weight percent by total weight of composition.

The present invention is not restricted to the above ingredients but may include other ingredients which do not detract from flame retardant properties of the flame retardant agent. Accordingly, other organic or inorganic materials may be added under the above conditions, including antimony trioxide and antimony tetraoxide in total amounts less than the amount of antimony pentoxide.

The following non-limiting examples further illustrate the present invention. All parts are by weight unless otherwise indicated.

EXAMPLES 1-3 AND COMPARATIVE EXAMPLES 4-9

Epoxy encapsulants were prepared from the formulations indicated in Table 1. Formulation 1, 4 and 7, formulations 2, 5 and 8 and formulations 3, 6 and 9 are each essentially the same except for the antimony oxide component employed (and the silica levels employed to achieve a constant total inorganic level). The three groups of formulations differ in amounts of epoxy resin and hardener ingredients to compensate for the epoxy equivalent supplied by the brominated glycidyl ether in formulations 1, 3, 4, 6, 7 and 9. In particular, all of the ingredients except the silane coupling agent were weighed into a porcelain ball jar of suitable size and milled for one hour. The silane coupling agent was then added and milling continued for an additional three hours to give a finely divided, homogeneous powder product. The powder was then formed into sheets on a heated differential roll mill. After cooling, the sheets were ground to a uniform, granular product in a hammer mill.

TABLE 1

|  | Examples | | | Comparative Examples | | | | | |
|---|---|---|---|---|---|---|---|---|---|
|  | 1 | 2 | 3 | 4 | 5 | 6 | 7 | 8 | 9 |
| Epoxy Resin[1] | 15.44 | 16.25 | 15.44 | 15.44 | 16.25 | 15.44 | 15.44 | 16.25 | 15.44 |
| Brominated Ether[2] | 1.60 | — | — | 1.60 | — | — | 1.60 | — | — |
| Brominated Ether[3] | — | — | 1.60 | — | — | 1.60 | — | — | 1.60 |
| Brominated Bisphenol A[4] | — | 1.36 | — | — | 1.36 | — | — | 1.36 | — |
| Novolac Hardener[5] | 7.96 | 7.39 | 7.96 | 7.96 | 7.39 | 7.96 | 7.96 | 7.39 | 7.96 |
| Catalyst[6] | 0.15 | 0.15 | 0.15 | 0.15 | 0.15 | 0.15 | 0.15 | 0.15 | 0.15 |
| $Sb_2O_3$ | — | — | — | — | — | — | 0.96 | 0.96 | 0.96 |
| $Sb_2O_4$* | — | — | — | 2.02* | 2.02* | 2.02* | — | — | — |
| $Sb_2O_5$[11] | 1.07 | 1.07 | 1.07 | — | — | — | — | — | — |
| Alumina[7] | 15.00 | 15.00 | 15.00 | 15.00 | 15.00 | 15.00 | 15.00 | 15.00 | 15.00 |
| Silica[8] | 58.01 | 58.01 | 58.01 | 57.06 | 57.06 | 57.06 | 58.12 | 58.12 | 58.12 |
| Pigment[9] | 0.25 | 0.25 | 0.25 | 0.25 | 0.25 | 0.25 | 0.25 | 0.25 | 0.25 |
| Lubricant | 0.32 | 0.32 | 0.32 | 0.32 | 0.32 | 0.32 | 0.32 | 0.32 | 0.32 |
| Coupling Agent[10] | 0.20 | 0.20 | 0.20 | 0.20 | 0.20 | 0.20 | 0.20 | 0.20 | 0.20 |

*$Sb_2O_4$, 50 weight percent coated on silica - thus 2.02% is equivalent to 1.01% $Sb_2O_4$ and 1.01% silica The identity or grade of these ingredients is as follows:
1. An epoxy cresol novolac resin with a softening point (by ASTM E-28) of 67°–76° C. and an epoxy equivalent weight of 200–222.
2. A tetrabromo bisphenol A glycidyl ether resin with a softening point (Durrans) of 55°–65° C., an epoxy equivalent weight of 350–450 and 50% bromine by weight. pl 3. A tetrabromo bisphenol A glycidyl ether resin with a softening point (Durrans) of 70°–80° C., an epoxy equivalent weight of 450–470 and 50% bromine by weight.
4. Tetrabromo bisphenol A.
5. Solid Phenol Novolac Resin with an average number of ten phenol groups per resin molecule.
6. 2,4,6-tris(dimethylaminomethyl) phenol.
7. Tabular aluminum oxide.
8. Crystalline silica (quartz) powder.
9. Carbon black.
10. Silane 3-(2,3 epoxy propoxy) propyl trimethoxy-.
11. A commercial colloidal antimony pentoxide; a typical assay indicates 83% antimony pentoxide with the remainder water and alkali metal compounds believed to be present as antimonate complexes.

Twenty 14 lead 7400 TTL Circuits were encapsulated with each encapsulant in a 20 cavity mold. Each encapsulant was preheated to 180°–200° F. (82°–93° C.) and molded at a mold temperature of 350° F. (176.7° C.) and a mold pressure of 600 psia (42.2 kg/cm²) with a cycle time of 75 seconds. All encapsulated devices were post-baked 2 hours at 175° C. The devices were then trimmed, formed and tested for acceptability against the standard electrical and functional specifications established for 7400 TTL Circuits. Devices which failed were removed, leaving from 17–20 devices for each encapsulant. These devices were then aged at 200° C. in a forced convection oven and periodically retested, with the failing devices removed. Failures noted at this point were predominantly of the parametric type. The results are shown in Table 2.

TABLE 2

| Encapsulant | 1 | 2 | 3 | C4 | C5 | C6 | C7 | C8 | C9 |
|---|---|---|---|---|---|---|---|---|---|
| Number of Devices | 17 | 17 | 19 | 20 | 19 | 18 | 17 | 17 | 19 |
| Percent Failure After: | | | | | | | | | |
| 4 Days | None | None | None | None | None | None | None | None | None |
| 6 Days | " | " | " | " | " | " | None | None | None |
| 8 Days | " | " | " | " | " | " | 5.9 | None | None |
| 10 Days | " | " | None | None | " | " | 35.3 | 17.6 | 10.5 |
| 12 Days | " | " | 15.8 | 20.0 | None | " | 94.1 | 41.2 | 52.6 |
| 14 Days | None | None | 15.8 | 95.0 | 5.3 | None | 94.1 | 70.6 | 94.7 |
| 16 Days | 5.9 | 5.9 | 15.8 | 100 | 42.1 | 61.1 | 100 | 94.1 | 100 |
| 18 Days | 11.8 | 5.9 | 15.8 | | 94.7 | 94.4 | | 100 | |
| 20 Days | 29.4 | 35.3 | 15.8 | | 100 | 100 | | | |
| 22 Days | 64.7 | 47.1 | 21.1 | | | | | | |
| 24 Days | 70.6 | 47.1 | 36.8 | | | | | | |
| 26 Days | 82.4 | 70.6 | 42.1 | | | | | | |
| 28 Days | 94.1 | 94.1 | 47.4 | | | | | | |
| 30 Days | 94.1 | 100 | 84.2 | | | | | | |
| 32 Days | 100 | | 89.5 | | | | | | |
| 34 Days | | | 100 | | | | | | |

The properties of the cured encapsulants of Example 1 and Comparative Examples 4 and 7 were further determined according to UL-94 (one sixteenth inch) and ASTM D150. All three samples would be rated V-O by UL-94 with the total burns being 15, 11.5 and 19 seconds. The electrical properties at 100 Hz (dielectric constant and dielectric loss factor, both wet and dry) were essentially the same for materials from Example 1 and Comparative Examples C4 and C7. In all other physical and electrical properties tested thus far, encapsulants with antimony pentoxide gave essentially equivalent performance to similar encapsulants with antimony trioxide or antimony tetraoxide. It is expected that the present compositions will continue to perform as well in other physical and electrical tests.

EXAMPLES 10-12

Examples 1-3 are repeated with the ingredients in proportions as shown in Table 3. In each example a resin component (A) and a hardener component (B) are prepared separately.

These mixtures are separately granulated on an extruder and then ingredients A and B are mixed in proportions giving the final composition in a screw preheater. The mixed, preheated composition is then subjected to transfer molding. The resultant encapsulated devices are expected to have similar high temperatures stability to that shown in Examples 1-3.

TABLE 3

| | Example | | | | | |
|---|---|---|---|---|---|---|
| | 10 | | 11 | | 12 | |
| | A | B | A | B | A | B |
| Epoxy resin[1] | 15.44 | — | 16.25 | — | 15.44 | — |
| Brominated Ether[2] | 1.60 | — | — | — | — | — |
| Brominated Ether[3] | — | — | — | — | 1.60 | — |
| Brominated Bisphenol A[4] | — | — | — | 1.36 | — | — |
| Novolac Hardener[5] | — | 7.96 | — | 7.39 | — | 7.96 |
| Catalyst[6] | — | 0.15 | — | 0.15 | — | 0.15 |
| $Sb_2O_5$ | — | 1.07 | — | 1.07 | — | 1.07 |
| Alumina[7] | 10.20 | 4.80 | 9.75 | 5.25 | 10.20 | 4.80 |
| Silica[8] | 39.50 | 18.51 | 37.71 | 20.30 | 39.50 | 18.51 |
| Pigment[9] | .13 | .12 | .13 | .12 | .13 | .12 |
| Lubricant | .16 | .16 | .16 | .16 | .16 | .16 |
| Coupling Agent[10] | .10 | .10 | .10 | .10 | .10 | .10 |
| TOTALS (%) | 67.13 | 32.87 | 64.10 | 35.90 | 67.13 | 32.87 |

Footnotes 1-10 refer to Table 1

What is claimed is:

1. In a method of encapsulating a semiconductor device wherein a thermosetting epoxy molding compound is cured in a liquid state in a mold surrounding a semiconductor device, said epoxy molding compound comprising a mixture of an epoxy, a hardener selected from phenol-derived and substituted phenol-derived resin, carboxylic acid anhydride and amine hardeners, a catalyst, a mold release agent, optionally a filler, optionally a colorant, optionally a coupling agent and a flame retardant system which may include one or more of the other ingredient; the improvement wherein the flame retardant system comprises about one percent antimony pentoxide by weight of molding compound and from about 1.3 to about 1.6 percent of a reactive bromine-containing organic compound by weight of molding compound.

2. The method of claim 1 wherein said hardener is a phenolic novolac.

3. The method of claim 1 wherein said hardener is an anhydride.

4. The method of claim 3 wherein said hardener is a polyanhydride of a maleic monomer and at least one alkyl sytrene monomer or prepolymers of the polyanhydride and the epoxy resin.

5. The method of claim 1 wherein said epoxy molding compound comprises at least about 50 weight percent of an inorganic filler.

6. The method of claim 5 wherein said inorganic filler includes silica.

7. The method of claim 6 wherein said epoxy molding compound comprises between about 55 and about 75 weight percent silica.

8. The method of claim 5 wherein said epoxy molding compound includes a silane coupling agent.

9. The method of claim 1 wherein said epoxy molding compound comprises:
   (a) about 1-50 weight percent epoxy;
   (b) about 1-40 weight percent of a phenol-derived or substituted phenol-derived resin hardener;
   (c) an effective amount of a catalyst for the reaction between said epoxy resin and said hardener; and
   (d) an effective amount of a mold release agent for release of the cured encapsulated device from the mold.

10. The method of claim 9 wherein said epoxy is about 5-25 weight percent of said epoxy molding compound, said phenol-derived or substituted phenol-derived resin hardener is about 5-20 weight percent said epoxy molding compound and said epoxy molding compound further comprises between about 50 and about 85 weight percent of a filler.

11. The method of claim 9 wherein said halogen-containing organic compound is tetrabromobisphenol A.

12. The method of claim 9 wherein said halogen-containing organic compound is a diglycidyl ether of tetrabromobisphenol A.

13. The method of claim 9 wherein said bromine-containing organic compound is part of said epoxy resin.

14. The method of claim 9 wherein said bromine-containing organic compound is part of said phenol-derived or substituted phenol derived resin hardener.

15. The method of claim 1 wherein said bromine-containing organic compound is part of said epoxy resin.

16. The method of claim 1 wherein said bromine-containing organic compound is part of said hardener.

17. The method of claim 1 wherein said semiconductor device is a treated silicon wafer.

18. The method of claim 1 wherein said semiconductor device is selected from the group consisting of transistors, diodes and integrated circuits.

19. An epoxy molding compound comprising:
   (a) about 5-25 percent by weight of compound of an epoxy;
   (b) about 5-20 percent by weight of compound of a phenol-derived or a substituted phenol derived resin hardener;
   (c) an effective amount of a catalyst for the reaction between said epoxy resin and said hardener in an amount of from about 0.1 to 5% by weight of the combined weight of epoxy and hardener;
   (d) an effective amount of a mold release agent for the release of the cured molding compound from a mold in an amount of between about 0.01 and about 2 percent by weight of compound;
   (e) between about 50 and about 85 percent by weight of compound of a filler; and
   (f) a flame retardant system of:
      (1) about one percent antimony pentoxide by weight of molding compound and
      (2) from about 1.3 to about 1.6 percent of a reactive organic bromine-containing compound by weight of molding compound which may include one or more of the other components.

20. The epoxy molding compound of claim 19 wherein said reactive bromine-containing organic compound is tetrabromobisphenol A.

21. The epoxy molding compound of claim 19 wherein said reactive bromine-containing organic compound is a diglycidyl ether of tetrabromobisphenol A.

22. The epoxy molding compound of claim 19 wherein said bromine-containing organic compound is part of said epoxy.

23. The epoxy molding compound of claim 19 wherein said bromine-containing organic compound is part of said phenol-derived or substituted phenol-derived resin hardener.

24. A semiconductor device encapsulated by the method of claim 1, claim 2, claim 5, claim 9, claim 10, or claim 18.